(12) United States Patent
Ishida et al.

(10) Patent No.: US 7,115,904 B2
(45) Date of Patent: Oct. 3, 2006

(54) METHOD OF MANUFACTURING ORGANIC ELECTROLUMINESCENT DEVICE, ORGANIC ELECTROLUMINESCENT DEVICE, SUBSTRATE FOR ORGANIC ELECTROLUMINESCENT DEVICE, AND ELECTRONIC APPARATUS

(75) Inventors: Yukimasa Ishida, Fujimi-machi (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/013,683

(22) Filed: Dec. 17, 2004

(65) Prior Publication Data
US 2005/0186698 A1 Aug. 25, 2005

(30) Foreign Application Priority Data
Feb. 24, 2004 (JP) ............................. 2004-048016

(51) Int. Cl.
*H01L 29/04* (2006.01)
*H01L 21/00* (2006.01)

(52) U.S. Cl. .................. 257/59; 257/72; 438/149; 438/152; 438/164; 438/99

(58) Field of Classification Search ............... 438/149, 438/152, 164, 99; 257/59, 72
See application file for complete search history.

(56) References Cited

U.S. PATENT DOCUMENTS

| 6,057,647 | A | * | 5/2000 | Kurosawa et al. ....... 315/169.3 |
| 6,351,066 | B1 | | 2/2002 | Gyoutoku et al. |
| 2004/0056588 | A1 | * | 3/2004 | Nozawa .................... 313/504 |

FOREIGN PATENT DOCUMENTS

| JP | A-10-253976 | 9/1998 |
| JP | B2-3328297 | 7/2002 |
| JP | B2-3428397 | 5/2003 |

* cited by examiner

*Primary Examiner*—Hsien-Ming Lee
(74) *Attorney, Agent, or Firm*—Oliff & Berridge, PLC

(57) ABSTRACT

To provide an organic electroluminescent device, a manufacturing method thereof, and an electronic apparatus, which can reduce wiring line resistance, lower power consumption, suppress heating and uniformize brightness. There is provided a method of manufacturing an organic electroluminescent device comprising, on a first electrode, a light-emitting functional layer surrounded by a first partition and a second partition. The method comprises a step of sequentially film-forming a first electrode material and a first partition material on an interlayer insulating film, a step of patterning the first electrode material and the first partition material with a mask to form the first electrode and the first partition in the same shape, and a step of forming the second partition on the interlayer insulating film and the first partition material.

14 Claims, 7 Drawing Sheets

METHOD OF MANUFACTURING ORGANIC ELECTROLUMINESCENT DEVICE, ORGANIC ELECTROLUMINESCENT DEVICE, SUBSTRATE FOR ORGANIC ELECTROLUMINESCENT DEVICE, AND ELECTRONIC APPARATUS

BACKGROUND

The present invention relates to a method of manufacturing an organic electroluminescent device, an organic electroluminescent device, a substrate for an organic electroluminescent device, and an electronic apparatus.

Conventionally, in an organic electroluminescent (hereinafter, referred to as organic EL) device, a plurality of circuit elements, an anode, a light emitting functional layer having a hole injecting layer or an organic EL material (light-emitting element), a cathode and so on are deposited on a substrate, and these elements are sealed by a sealing substrate so as to be interposed between the substrate and the sealing substrate.

More specifically, the anode made of a transparent conductive material such as indium tin oxide (ITO) or tin oxide ($SnO_2$), the hole injecting layer made of a dopant of polythiophene derivative (hereinafter, referred to as PEDOT), a light-emitting layer made of a light-emitting material such as polyfluorene, the cathode made of a metallic material having low work function such as Ca or a metallic compound are sequentially deposited on a transparent substrate such as a glass substrate on which switching elements such as thin film transistors are formed.

In recent years, as a manufacturing method of the organic EL devices, a manufacturing method using a liquid droplet ejection method is suggested. In such a manufacturing method, before ejecting liquid droplets, a step of forming a liquid droplet receiving portion is performed. In forming the liquid droplet receiving portion, a step of forming a semiconductor (thin film transistor) 300 and an interlayer insulating film 301 shown in FIG. 7(a), a step of forming a pixel electrode 302 shown in FIG. 7(b), a step of forming a first partition 303 shown in FIG. 7(c), and a step of forming a second partition 304 shown in FIG. 7(d) are performed, such that the liquid droplet receiving portion 305 is formed. And then, a surface reforming treatment such as a plasma treatment is performed on a surface of the liquid droplet receiving portion 305 to form a liquid-repellent portion and a lyophilic portion. Subsequently, liquid droplets having a functional material are ejected on the liquid droplet receiving portion 305, to thereby form a functional element (for example, see Patent Document 1).

[Patent Document 1] Japanese Patent No. 3328297

SUMMARY

However, in the above-mentioned manufacturing method, when the pixel electrode 302 is formed, a resist mask for patterning the pixel electrode 302 contacts the material of the pixel electrode 302, which results in a problem in that the remnants of the resist mask contaminate the surface of the pixel electrode 302. Further, if the light-emitting functional layer such as the hole injecting layer or the light-emitting layer is formed on the contaminated surface of the pixel electrode 302, there is a problem in that the reliability of the light-emitting functional layer is lowered.

In addition, when the interlayer insulating film 301 is coated and formed by using an organic material such as acryl or polyimide, the following problems are caused.

(1) When the pixel electrode 302 or the first partition 303 is patterned by means of a wet process such as wet etching or resist separation, the organic material of the interlayer insulating film 301 may be swelled, and then a stress may be generated in the pixel electrode 302 or the first partition 303 which is planarly connected. In particular, a pixel region (the pixel electrode 302) which is important for display characteristics may be damaged. Further, the interlayer insulating film 301 and the first partition 303 may be separated from each other.

(2) If the first partition 303 is formed on the interlayer insulating film 301 made of an organic material using plasma CVD method, the first partition 303 is film-formed while damaging the surface of the organic material. Thus, the adhesion between the first partition 303 and the interlayer insulating film 301 may be lowered, and as a result, the first partition 303 and the interlayer insulating film 301 may be easily separated from each other. Here, if the film is separated, particles are scattered to contaminate a vacuum chamber. Further, because of the presence of the particles in the vacuum chamber or on a base substrate, the yield of an organic electroluminescent device may be lowered.

(3) The first partition 303 is formed to cover the surfaces of the pixel electrode 302 made of an inorganic material and the interlayer insulating film 301 made of an organic material. In this case, since the etching rate of the organic material is larger than that of the inorganic material, it is difficult to control the etching process in case of etching the first partition 303.

The present invention is made in consideration of the above problems, and it is an object of the present invention to provide a method of manufacturing an organic electroluminescent device, in which the damage to the pixel regions can be suppressed, the contamination of a vacuum chamber can be prevented, and the etching characteristic of a first partition can be controlled. Further, it is another object of the present invention to provide an organic electroluminescent device, a substrate for an organic electroluminescent device and an electronic apparatus.

In order to achieve the above objects, the present invention adopts the following construction.

A method of manufacturing an organic EL device of the present invention, the organic EL device having, on a first electrode, a light-emitting functional layer surrounded by a first partition and a second partition, comprises a step of sequentially film-forming a first electrode material and a first partition material, on an interlayer insulating film, a step of patterning the first electrode material and the first partition material with a mask to form the first electrode and the first partition in the same shape, and a step of forming the second partition on the interlayer insulating film and the first partition material.

According to this construction, in the step of forming the first electrode, a resist mask for patterning the first electrode and the first electrode material are maintained not to contact each other, and thus it is possible to prevent the first electrode from being contaminated due to remnants of the resist mask. Therefore, since the light-emitting functional layer such as the hole injecting layer of the light-emitting layer is formed on the first electrode having a clean surface state, reliability of the light-emitting functional layer is advanced, and thus it is possible to provide a favorable organic EL device.

Further, the interlayer insulating film is preferably made of an organic material. By using the organic material, it is possible to form the interlayer insulating film with a wet film-forming method. Thus, as compared with a vacuum film-forming method, it is possible to film-form using a simple apparatus at low manufacturing cost. Further, while, in the vacuum film-forming method, it is difficult to form a thick film, according to the wet film-forming method, it is possible to easily form the thick film.

Further, before film-forming the first partition material, the first electrode material is formed on the interlayer insulating film, and thus the interlayer insulating film is protected by the first electrode material. Therefore, even when the first partition material is film-formed using a plasma CVD method, the interlayer insulating film itself is not exposed to plasma. Thus, it is possible to prevent the interlayer insulating film from being damaged due to plasma, and thus it is possible to form the first partition material stably.

Further, since the first partition is formed only on the first electrode, a total area of the first electrode and the first partition contacting the organic material becomes small as compared with the prior art. Therefore, in the case in which stress is caused in the interlayer insulating film during the manufacturing process or in completed goods, the stress is reduced, and thus it is possible to suppress damage or separation generating.

Further, since the interlayer insulating film and the first partition are maintained not to contact each other, there is no case in which separation is generated in a joining surface of the interlayer insulating film and the first partition, which was a problem in the prior art.

Further, since the organic material is adopted as the material of the second partition, the interlayer insulating film and the second partition are made of the organic material together. Thus, it is possible to advance adhesion between the interlayer insulating film and the second partition. And then, in such a structure, since the organic materials having the same hardness contact each other, it is also possible to advance the degree of strength of the organic EL device.

Further, even when the first partition material is formed using the plasma CVD method, the interlayer insulating film is not exposed at that time, and thus there is no case in which the organic material of the interlayer insulating film is etched due to damages by means of plasma. As a result, it is possible to prevent a manufacturing device from being contaminated due to etching of the organic material.

Further, in the prior art, since the first partition material is formed on a plurality of layer films including the interlayer insulating film and the first electrode material, it is difficult to control etching of the first partition material. However, in the present invention, since the first partition is formed only on the first electrode material, it is possible to control favorably etching, and further it is possible to suppress non-uniform etching rate of the first partition within its surface.

Further, since the first electrode material and the first partition material are sequentially film-formed on the interlayer insulating film and patterned with the mask of the same shape, it is not necessary to pattern the first electrode material and the first partition material separately, and then it is possible to simply the manufacturing process.

And then, in such a manufacturing method, a liquid droplet receiving portion comprised of the first partition and the second partition on the first electrode is formed. Thus, with the ink jet method, by ejecting a liquid material of the light-emitting functional layer in the liquid droplet receiving portion in liquid droplets, the light-emitting functional layer can be formed within the liquid droplet receiving portion.

Further, the above-mentioned method of manufacturing an organic EL device further comprises a step of removing a portion of the first partition to expose the first electrode.

Here, after a mask for removing the portion of the first partition is formed, the first electrode is exposed according to the mask.

According to this construction, with the liquid droplet ejection method, by ejecting the liquid material of the light-emitting functional layer toward the first electrode to land onto an exposed surface of the first electrode, the light-emitting functional layer can be formed.

Further, in the above-mentioned method of manufacturing an organic EL device, the step of forming the second partition is performed by forming a second partition material on an entire surface of the substrate and then forming an opening portion in a portion corresponding to the first electrode.

Here, after the second partition material is formed on an entire surface of the substrate by means of the wet film-forming method, a mask according to a pattern of the opening portion is arranged, and then the opening portion is formed according to the mask pattern.

According to this construction, by providing the opening portion in the second partition material, it is possible to form the liquid droplet receiving portion in the portion corresponding to the first electrode.

Further, in the above-mentioned method of manufacturing an organic EL device, after the first electrode is exposed, the second partition is formed.

According to this construction, in the state in which the first electrode is exposed, the second partition material is coated on the entire surface, and the opening portion is formed. Thus, it is possible to surely expose the first electrode after the opening portion is formed.

Further, in the above-mentioned method of manufacturing an organic EL device, after the second partition is formed, the first electrode is exposed.

According to this construction, the first partition is patterned with the second partition as a mask, and then the first electrode is exposed. Thus, it is not necessary for a mask which is only to expose the first electrode, and thus it is possible to reduce the number of the masks. Therefore, it is possible to simply the manufacturing process.

Further, in the above-mentioned method of manufacturing an organic EL device, after the first electrode is exposed, an opening area of the second partition is expanded.

According to this construction, a surface of the first partition covered with the second partition is exposed, and an exposed area of the first partition becomes large. Therefore, in the case in which the liquid material of the light-emitting functional layer is coated and formed onto the liquid droplet receiving portion using the liquid droplet ejection method in a subsequent step, a contact area of the liquid material and the first partition becomes large. That is, it is possible to make the liquid material on the first partition having a lyophilic property get wet and spread, and further it is possible to make the liquid material surely contact the first electrode.

Further, in the above-mentioned method of manufacturing an organic EL device, the first partition is formed by patterning the first partition material according to a mask formed on the first partition material, and the first electrode is formed by patterning the first electrode material using the first partition as a mask.

According to this construction, it is possible to form the first partition according to the shape of the mask, and further it is possible to form the first electrode according to a planar shape of the first partition. Thus, it is possible to form the first partition and the first electrode with the mask of the same shape.

Further, in the above-mentioned method of manufacturing an organic EL device, the first partition and the first electrode are formed by collectively patterning the first electrode material and the first partition material according to the shape of a mask formed on the first partition material.

According to this construction, it is possible to form the first partition and the first electrode according to the same mask shape. In addition, since the first partition and the first electrode are formed by means of the collective patterning, it is possible to simply the number of the steps. Further, in this method, since the first partition is not used as a mask, there is no case in which at the time of patterning the first electrode material, a wet etchant or an etching gas contacts an upper surface of the first partition. Therefore, it is possible to prevent the wet etchant or the etching gas from influencing the upper surface of the first partition.

Further, in the above-mentioned method of manufacturing an organic EL device, the first partition and the first electrode are formed by patterning the first partition material and the first electrode material using a dry etching method.

In such a manner, since the dry etching method is used; the interlayer insulating film (organic material) is not swelled due to a wet process, and thus it is possible to prevent the stress in the interlayer insulating film from being caused.

Moreover, in the prior art, in the case in which the first partition material is formed with the plasma CVD method, there are problems in that the first partition and the interlayer insulating film may be easily separated from each other and contamination within the vacuum chamber may be caused. In the present invention, however, since dry etching (plasma treatment) is performed in the patterning step, not in the film-forming step, contamination within the vacuum chamber due to separation of the film is not caused.

Further, in the above-mentioned method of manufacturing an organic EL device, an adhesion imparting film is formed on the interlayer insulating film to impart adhesion between the interlayer insulating film and the first electrode.

According to this construction, since the adhesion imparting film surely adheres between the interlayer insulating film and the first electrode, it is possible to advance the degree of strength of the organic EL device.

Further, there is provided an organic EL device of the present invention having, on a first electrode, a light-emitting functional layer surrounded by a first partition and a second partition, in which the first partition and the second partition are formed on side portions of the light-emitting functional layer, and the first partition is formed only on the first electrode.

Here, the first electrode and the first partition are formed by sequentially film-forming the first electrode material and the first partition material on the interlayer insulating film and then patterning the first electrode material and the first partition material in the same shape with a mask. If doing so, it is possible to obtain the same advantages as those of the above-mentioned manufacturing method.

Further, there is provided a substrate for an organic EL device of the present invention, the substrate for the organic electroluminescent device having a first partition formed on a first electrode, in which the first electrode is formed on an interlayer insulating film, and the first partition is formed only on the first electrode.

Here, the first electrode and the first partition are formed by sequentially film-forming the first electrode material and the first partition material on the interlayer insulating film and then patterning the first electrode material and the first partition material in the same shape with a mask.

If doing so, it is possible to obtain the same advantages as those of the above-mentioned manufacturing method.

In addition, a second partition may be formed to the substrate for the organic EL device, and a light-emitting functional layer surrounded by the first partition and the second partition may be formed on the first electrode. Thus, it is possible to obtain the same advantages as those of the above-mentioned organic EL device.

Further, an electronic apparatus of the present invention comprises an organic EL device described above.

As such an electronic apparatus, for example, a portable information processing device such as a cellular phone, a mobile information terminal, a watch, a word processor or a personal computer can be exemplified. Further, a television having a large-sized display screen or a large-sized monitor can also be exemplified. In such a manner, if the organic EL device of the present invention is adopted as a display unit of the electronic apparatus, it becomes possible to provide an electronic apparatus having favorable display characteristics.

DETAILED DESCRIPTION OF EMBODIMENTS

Next, a manufacturing method of an organic electroluminescent device, an organic electroluminescent device, a substrate for an organic electroluminescent device and an electronic apparatus of the present invention will be described with reference to FIGS. 1 to 5.

Moreover, the present embodiment is just an example of the present invention, and is not intended to limit the present invention. The present invention can be arbitrarily modified within a scope of a technical idea of the present invention. Further, in the respective drawings shown below, the respective layers or members are shown in a recognizable size on the drawings, and thus the respective layers or members are illustrated with different scales.

(First Embodiment of Manufacturing Method of Organic EL Device)

A first embodiment of a manufacturing method of an organic EL device will be described with reference to FIG. 1.

Figure 1A:
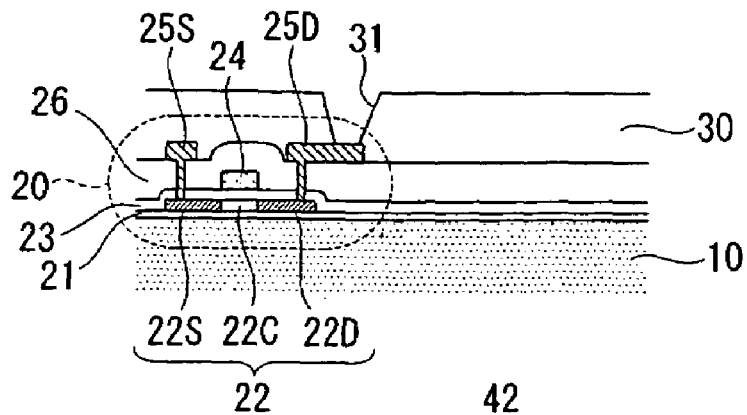
FIG. 1 is a diagram illustrating a manufacturing method of an organic EL device according to a first embodiment of the present invention.
Figure 1B:
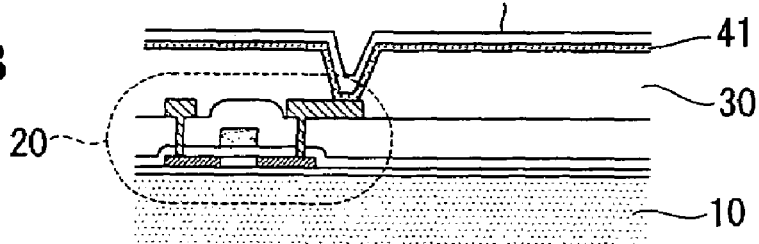
Figure 1C:
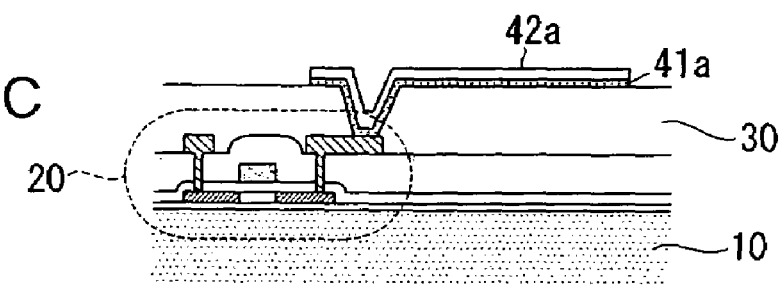

Here, FIGS. 1(a) to 1(e) and 2 are diagrams illustrating a manufacturing method of an organic EL device, and FIG. 3 is a diagram illustrating FIG. 1(c) in detail.

To begin with, as shown in FIG. 1(a), a thin film transistor 20, an interlayer insulating film 30 and a contact hole 31 are formed on a substrate 10.

The substrate 10 is a glass substrate. Moreover, the material is not limited to glass, and, for example, materials such as quartz, resin (plastic, plastic film) or the like may be adopted. If such a transparent or translucent material is adopted, it becomes possible to manufacture a so-called bottom emission type organic EL device in which emitted light is derived from the substrate 10 side. Further, as described below, in a so-called top emission type in which emitted light is derived from a sealing substrate side, as the material for the substrate, a non-transparent material may be adopted.

The thin film transistor 20 is comprised of a base insulating film 21, a semiconductor layer 22, a gate insulating film 23, a gate electrode 24, a source electrode 25S, a drain electrode 25D and an upper insulating film 26.

Here, the base insulating film 21 is an insulating film to be formed on the substrate 10 and it is a layer film, which separates the substrate 10 and the semiconductor layer 22.

Further, the semiconductor layer 22 is comprised of a source region 22S, a channel region 22C and a drain region 22D. The semiconductor layer 22 is a layer film for switching between the source region 22S and the drain region 22D by means of reactions of an electric field on the gate electrode 24.

Further, the gate insulating film 23 is a layer film provided between the gate electrode 24 and the semiconductor layer 22, to thereby electrically isolate the semiconductor layer 22 from the gate electrode 24.

Further, the gate electrode 24 is a layer film which is arranged to oppose the channel region 22C with the gate insulating film 23 interposed therebetween. By the amount of a current flowing in the gate electrode 24, desired switching characteristics of the thin film transistor 20 can be obtained.

The source electrode 25S and the drain electrode 25D are electrodes connected to the source region 22S and the drain electrode 22D via contact holes formed in the upper insulating film 26, respectively.

Such layer films and electrodes constituting the thin film transistor 20 are manufactured by a known manufacturing method. For example, various film-forming methods, photolithography methods, etching methods and so on are used. Further, in order to form the source region 22S, the channel region 22C and the drain region 22D in the semiconductor layer 22, an ion doping method is used.

The interlayer insulating film 30 is formed using an organic material or an inorganic material. Here, in case of adopting the organic material for the interlayer insulating film 30, for example, acryl resin or polyimide resin is suitably adopted. Among these materials, non-photosensitive resin or photosensitive resin is adopted.

Further, in case of film-forming such an organic material, a wet film-forming method is suitably adopted. As the wet film-forming method, a spin coat method, a dip method or a slit coat method is performed. Among such wet film-forming methods, the spin coat method is suitable, such that it becomes possible to film-form with a uniform thickness. Further, after film-forming step, it is necessary to perform a heat treatment to cure resin.

Further, in case of adopting the inorganic material for the interlayer insulating film 30, silicon oxide, silicon nitride or silicon oxinitride is adopted.

In case of film-forming the inorganic material, a vacuum film-forming method or a wet film-forming method is suitably adopted. As the vacuum film-forming method, a CVD method, a sputter method or a vapor deposition method is adopted. Further, as the wet film-forming method, the same spin coat method described above is adopted. As the inorganic material, perhydropolysilazane is preferably adopted. Perhydropolysilazane is a material name of a compound having —(SiH$_2$NH)— as a basic unit. Further, since perhydropolysilazane is an inorganic polymer which can be melted in an organic solvent, if it is mixed into the organic solvent, it can be treated as a liquid material. Further, when being baked at a high temperature under an inert atmosphere, perhydropolysilazane has a nature which is transformed into ceramics of silicon nitride by means of thermosetting shrinkage due to dehydrogenation reaction. Further, if it is baked under an air or a vapor-containing atmosphere, it has a nature which is transformed into silicon oxide by reacting to water or oxygen.

The above-mentioned wet film-forming method can easily form a thick film as compared to the vacuum film-forming method, and thus, in case of forming the interlayer insulating film 30, the wet film-forming method is preferably adopted. Further, in particular, it is preferable in that the surface of the interlayer insulating film 30 is smoothed by forming the thick film without transcribing an uneven shape of the thin film transistor 20 to the surface of the interlayer insulating film 30.

In addition, the contact hole 31 is formed in the interlayer insulating film 30.

Here, in a method of forming the contact hole 31, when the interlayer insulating film 30 is made of non-photosensitive resin or the inorganic material or when the interlayer insulating film 30 is made of photosensitive resin, the process for forming the contact hole is different.

First, a case in which the interlayer insulating film 30 is made of non-photosensitive resin or the inorganic material will be described.

In this case, the contact hole 31 is patterned by means of an etching treatment using photoresist. More specifically, after a photoresist film is coated on the interlayer insulating film 30, a heat treatment, an exposure treatment and a development treatment are performed to form an opening portion, and then non-photosensitive resin or the inorganic material corresponding to the opening portion is removed by means of an etching treatment, such that the contact hole 31 is formed.

To the contrary, in the case in which the interlayer insulating film 30 is made of photosensitive resin, a heat treatment, an exposure treatment and a development treatment are sequentially performed on the interlayer insulating film 30 itself, without using the photoresist film, such that the contact hole 31 is formed.

Next, as shown in FIG. 1(b), the pixel electrode material (the first electrode material) 41 and the first partition material 42 are formed on the interlayer insulating film 30 (a step of sequentially film-forming the first electrode material and the first partition material on the interlayer insulating film).

Here, when forming the pixel electrode material 41 and the first partition material 42, the pixel electrode material 41 and the first partition material 42 are consecutively film-formed, without patterning the pixel electrode material 41.

As the pixel electrode material 41, a transparent metallic film such as ITO is adopted. Further, other than ITO, for example, indium oxide/zinc oxide-based amorphous transparent conductive film (indium zinc oxide: IZO) (Registered Trademark) (manufactured by Idemitsu Kosan Co., Ltd.) may be used. Moreover, in the present embodiment, it is assumed that ITO is used. Further, in case of the top emission type, in particular, it is not necessary to adopt a light transmissive material, and, for example, Al may be provided at a lower layer side of ITO and it may be used as a reflecting layer.

Further, as a material for the first partition material 42, a material having a lyophilic property is adopted. In the present embodiment, silicon oxide is adopted. Moreover, the lyophilic property described in the present specification means that the first partition material has a lyophilic property relatively more than the second partition material (described below) to a liquid material to be coated later.

As a method of film-forming the pixel electrode material 41 and the first partition material 42, the vacuum film-forming method is suitably adopted.

Next, as shown in FIG. 1(c), the pixel electrode material 41 and the first partition material 42 are patterned, such that the pixel electrode (first electrode) 41a and the first partition 42a are formed (a step of patterning the first electrode material and the first partition material to form the first electrode and the first partition).

Here, patterning of the pixel electrode material 41 and the first partition material 42 will be described in detail with reference to FIG. 3. FIG. 3 is a diagram showing essential parts of the interlayer insulating film 30, the pixel electrode material 41 and the first partition material 42 in FIG. 1(c). Further, FIG. 3 is a diagram showing a manufacturing process until the pixel electrode 41a and the first partition 42a are formed by means of etching. Moreover, in FIG. 3, though the contact hole 31 is not shown, it is assumed that the contact hole 31 is formed in a portion which is not shown, and the pixel electrode material 41 and the drain electrode 25D are connected to each other via the contact hole 31.

Figure 3A:
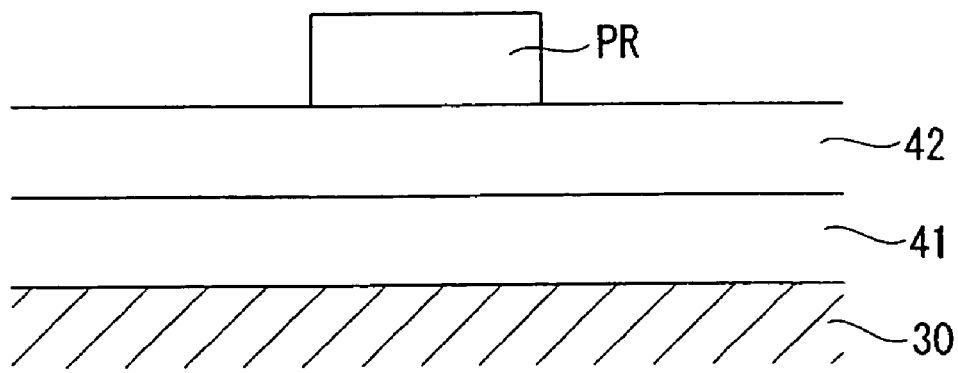
FIG. 3 is a diagram illustrating the manufacturing method of an organic EL device according to the first embodiment of the present invention.

As shown in FIG. 3(a), first, a mask (mask of same shape) PR is formed. The mask PR is formed by performing a heat treatment, an exposure treatment and a development treatment on the photoresist film which is coated and formed by means of the spin coat method.

Figure 3B:
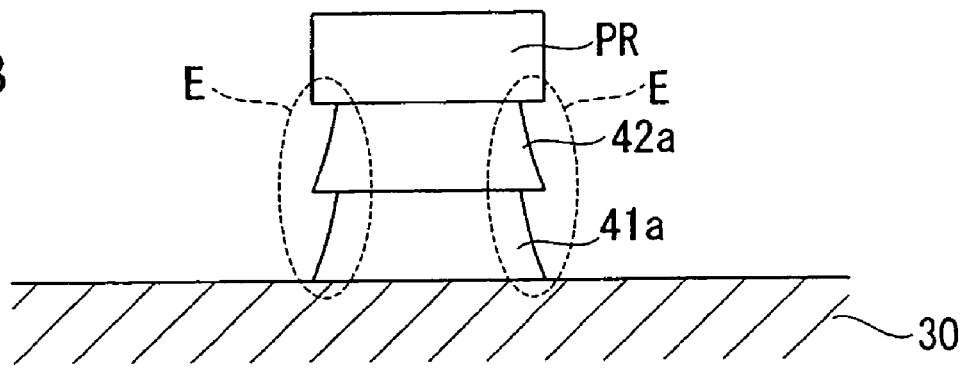

Next, as shown in FIG. 3(b), while making the mask PR remain, the pixel electrode material 41 and the first partition material 42 are etched, such that the pixel electrode 41a and the first partition 42a are formed.

Here, as the etching treatment, a wet etching method or a dry etching method is used. In the wet etching method, as an etchant which removes silicon oxide of the first partition material 42, an etchant mainly containing fluoric acid (HF) is suitably adopted. Further, as an etchant which removes ITO of the pixel electrode material 41, aqua regia is suitably adopted.

In such a wet etching method, after the first partition material 42 is patterned by being dipped into the etchant of HF, on the interlayer insulating film 30 and the pixel electrode material 41 are cleaned, and then the pixel electrode 41a is patterned by being dipped into the etchant of aqua regia.

Further, in the dry etching method, by exposing the first partition material 42 to plasma of fluorine-based gas, the first partition material 42 is removed.

Further, in the dry etching method which removes ITO of the pixel electrode material 41, a halide gas such as HBr or HI is used.

In such a dry etching method, since the treatments are performed within the same chamber while changing an etching gas, it becomes possible to collectively form the first partition 42a and the pixel electrode 41a. Further, the shapes of side portions of the first partition 42a and the pixel electrode 41a shown in FIG. 3(b) have scoops E. In this case, however, by using an anisotropic etching method (RIE) among the dry etching method, it becomes possible to suitably control the shapes of the side portions.

Moreover, in FIG. 3(b), it is important to make the mask PR remain, the dry etching method is preferably performed without using a gas, for example, plasma of an oxygen gas, which may remove the mask PR.

Figure 3C:
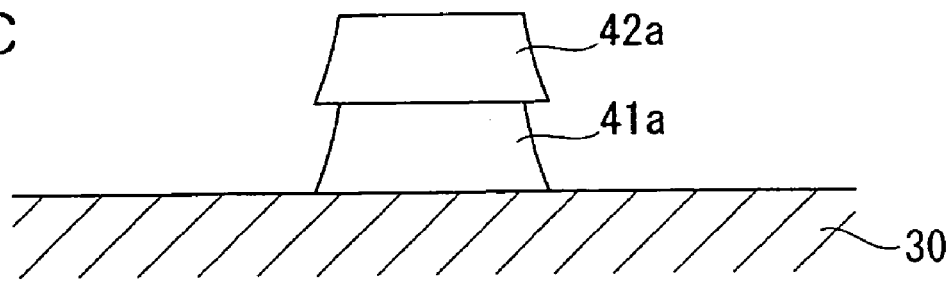

Next, as shown in FIG. 3(c), the mask PR is removed, and then patterning of the pixel electrode 41a and the first partition 42a is completed.

Next, returning to FIG. 1, a manufacturing method of an organic EL device will be described continuously.

Figure 1D:
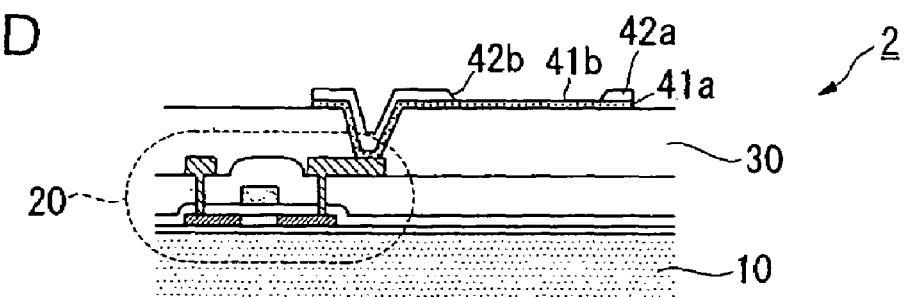

As shown in FIG. 1(d), a portion of the first partition 42a is removed to expose the pixel electrode 41a, and an electrode exposing portion 41b is formed (a step of removing a portion of the first partition to expose the first electrode).

Here, a mask which is not shown is formed on the first partition 42a, and by etching the first partition 42a according to a pattern of the mask, the electrode exposing portion 41b is formed. As an etching method of the first partition 42a, the above-mentioned wet etching method or dry etching method is suitably adopted. Further, by means of such an etching method, a partition side portion 42b is formed in the first partition 42a. The partition side portion 42b is preferably inclined at a predetermined angle more than the surface of the electrode exposing portion 41b.

By means of such a manufacturing method shown in FIGS. 1(a) to 1(d), a substrate 2 for the organic EL device is completed. Subsequently, a method of forming the organic EL device by sequentially forming the second partition and the light-emitting functional layer will be described with reference to FIGS. 1(e) and 2.

Figure 1E:
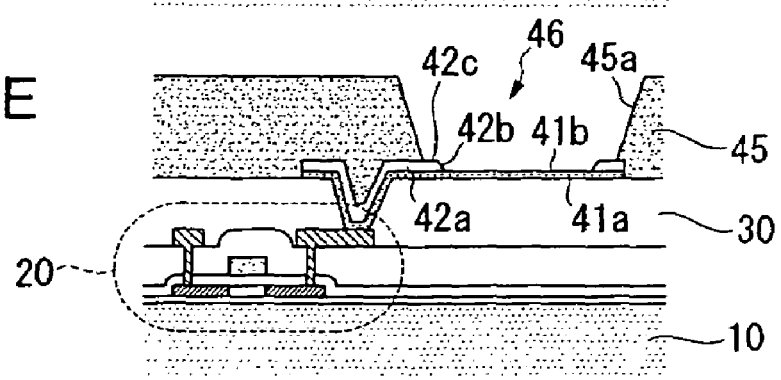

As shown in FIG. 1(e), in the substrate 2 for the organic EL device, the second partition 45 is formed to cover the interlayer insulating film 30 and the first partition 42a (a step of forming the second partition on the interlayer insulating film and the first partition material). Further, the second partition 45 is formed in a state in which the electrode exposing portion 41b is formed (a step of forming the second partition after exposing the first electrode).

Here, a method of forming the second partition 45 is performed by forming a material for the second partition 45 on an entire surface and then forming the opening portion 45a corresponding to the pixel electrode 41a.

As a material of such a second partition 45, an organic material such as acryl resin or polyimide resin is suitable. Alternatively, non-photosensitive resin or photosensitive resin is adopted. Further, in case of film-forming such an organic material, the wet film-forming method is suitably adopted. As the wet film-forming method, the spin coat method, the dip method or the slit coat method is performed. Among such a wet film-forming method, the spin coat method is suitable, such that it becomes possible to film-form with uniform thickness. Further, after film-forming step, a heat treatment is performed to cure resin.

In addition, the material of the second partition 45 and the material of the interlayer insulating film 30 are preferably the same. Alternatively, the second partition 45 and the interlayer insulating film 30 are made of the same organic material. If doing so, an adhesion force between the materials is advanced and thermal expansion coefficients are almost the same, and thus it is possible to obtain a stable structure for thermal stress or mechanical stress.

Further, in a method of forming the opening portion 45a, when the second partition 45 is made of non-photosensitive resin or when the second partition 45 is made of photosensitive resin, the process for forming the opening portion is different.

First, in case of non-photosensitive resin, patterning is performed by means of an etching treatment using a photoresist film. More specifically, after the photoresist film is coated and formed on the interlayer insulating film 30, a heat treatment, an exposure treatment and a development treatment are performed to form a mask opening portion. And then, the etching treatment is performed to remove non-photosensitive resin corresponding to the mask opening portion, such that the opening portion 45a is formed.

To the contrary, in the case in which the second partition 45 is made of photosensitive resin, the heat treatment, the exposure treatment and the development treatment are sequentially performed on the second partition 45 itself, without using the photoresist film, such that the opening portion 45a is formed.

Further, in forming the opening portion 45a, the partition side portion 42b and a partition upper portion 42c in the first partition 42a are preferably exposed. If doing so, when an ink jet method (liquid droplet ejection method) is used in a subsequent process, it becomes possible to make liquid droplets get wet and spread in the vicinity of the first partition 42a.

Further, if the opening portion 45a is formed, a liquid droplet receiving portion 46 which is surrounded by the first partition 42a and the second partition 45 on the pixel electrode 41a is formed. In addition, an $O_2$ plasma treatment or a $CF_4$ plasma treatment is performed on the liquid droplet receiving portion 46, such that the pixel electrode 41a has a lyophilic property and the second partition 45 has liquid-repellency. Thus, it becomes possible to hold a liquid material ejected by means of the ink jet method within the liquid droplet receiving portion 46, and further it becomes possible to make the liquid material get wet and spread suitably within the liquid droplet receiving portion 46.

Figure 2:
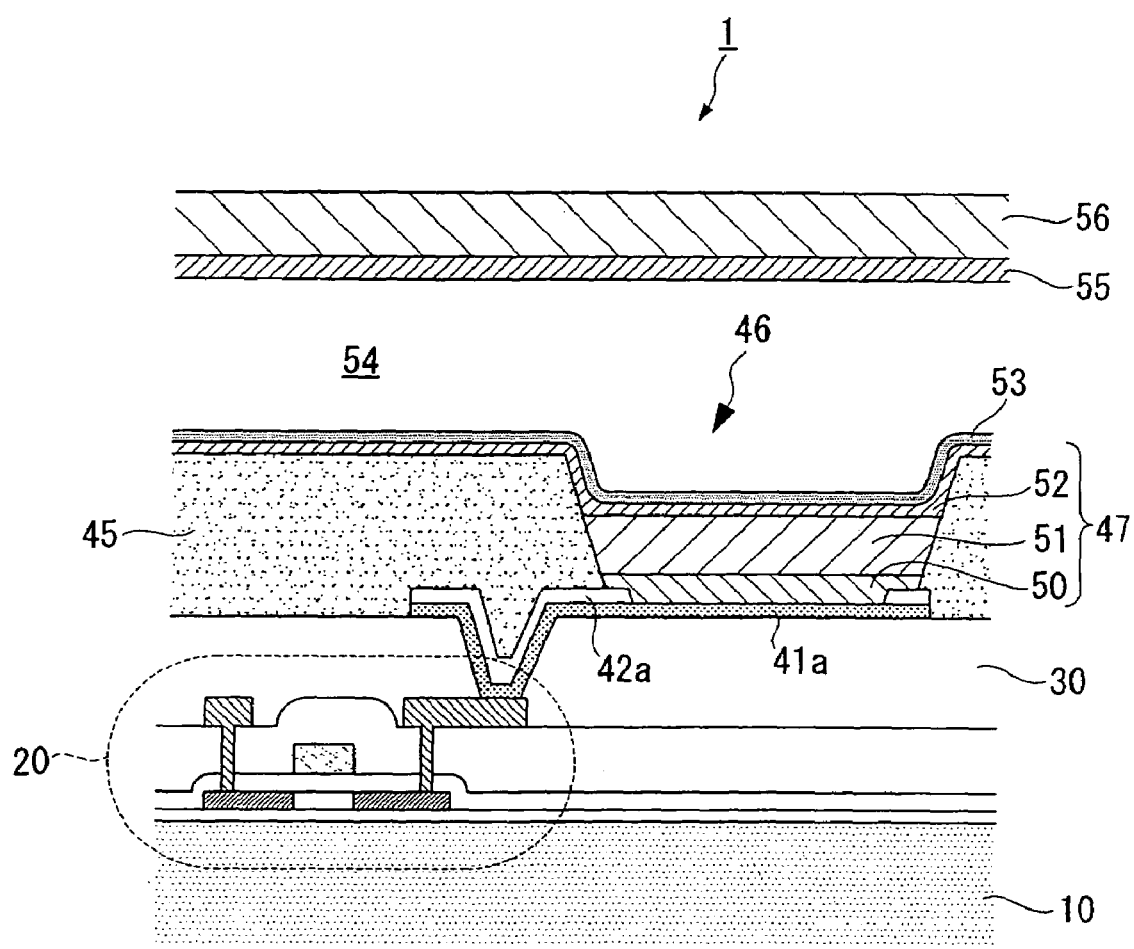
FIG. 2 is a diagram illustrating the manufacturing method of an organic EL device according to the first embodiment of the present invention.

Next, as shown in FIG. 2, the light-emitting functional layer 47 and the cathode 53 are formed, and the substrate 10 and the sealing substrate 56 are attached by means of sealing resin (not shown), such that the organic EL device 1 is completed. Here, inside of the sealing substrate 56 between the substrate 10 and the sealing substrate 56, a getter agent 55 which absorbs moisture or oxygen is attached. Further, in a space portion between the substrate 10 and the sealing substrate 56, nitrogen gas is filled to form a nitrogen gas filled layer 54. Based on such a construction, moisture or oxygen is suppressed to be penetrated inside the organic EL device 1, and thus the organic EL device 1 has long life span. Such an organic EL device 1 becomes a so-called bottom emission type organic EL device in which emitted light is derived from the substrate 10 side. In addition, as a material for sealing resin, preferably, the same material as that of the second partition 45 or the interlayer insulating film 30 is adopted. Alternatively, sealing resin is preferably made of the same organic material. If doing so, an adhesion force between the materials is advanced and thermal expansion coefficients are almost the same, and thus it is possible to obtain a stable structure for thermal stress or mechanical stress.

Next, respective elements of the light-emitting functional layer 47 and the cathode 53 will be described.

The light-emitting functional layer 47 has a hole injecting layer 50, a light-emitting layer 51 and an electron injecting layer 52 which are sequentially deposited from the pixel electrode 41a side toward the cathode 53.

As a material for forming the hole injecting layer 50, in particular, a dispersing solution of 3,4-polyethylenedioxythiophene/polystyrenesulfonic acid (PEDOT/PSS), that is, a dispersing solution in which 3,4-polyethylenedioxythiophene is dispersed into polystyrenesulfonic acid as a dispersing solvent and this solution is dispersed into water is suitably used.

Moreover, a material for forming the hole injecting layer 50 is not limited to the above-mentioned material, but various materials may be used. For example, a material obtained by dispersing polystyrene, polypyrrole, polyaniline, polyacetylene, or its derivative in a suitable dispersing solvent, such as polystyrenesulfonic acid described above, may be used.

As a material for forming the light-emitting layer 51, well-known light-emitting materials capable of emitting fluorescent light or phosphorescent light are used. Further, in order to form the organic EL device for full color display, the light-emitting layers 51 of the respective colors of R (red), G (green) and B (blue) are provided for every pixel electrode 41a.

As the material for forming the light emitting layer 51, specifically, for example, polyfluorene derivative (PF), poly-paraphenylenevinylene derivative (PPV), polyphenylene derivative (PP), polyparaphenylene derivative (PPP), polyvinylcarbazole (PVK), polythiophene derivative, or a polysilane-based material, such as polymethylphenylsilane (PMPS), is suitably used. Further, the light emitting layer may also be made of materials in which, into these high molecular materials, high molecular materials, such as perylene-based pigment, coumarin-based pigment, or rhodamine-based pigment, or low molecular materials, such as rubrene, perylene, 9,10-diphenylanthracene, tetraphenylbutadiene, Nile red, coumalin 6 or quinacridone are doped.

Further, as a material for forming the red light-emitting layer 51, for example, MEHPPV (poly(3-methoxy 6-(3-ethylhexyl)paraphenylenevinylene may be used, and as a material for forming the green light-emitting layer 51, for example, a mixture solution of polydioctylfluorene and F8BT (an alternating copolymer of dioctylfluorene and benzothiadiazole) may be used. Further, as a material for the blue light-emitting layer 51, for example, polydioctylfluorene may be used. Further, as regards such a light-emitting layer 51, the thickness is not particularly limited, and, for each color, the desired film thickness may be adjusted.

The electron injecting layer 52 is formed on the light-emitting layer 51. A material of the electron injecting layer 52 is suitably selected according to the material of the light-emitting layer 51. As a specific material, a fluoride of an alkali metallic material such as LiF (lithium fluoride), NaF (sodium fluoride), KF (potassium fluoride) RbF (rubidium fluoride) or CsF (cesium fluoride), or an oxide of an alkali metallic material such as $Li_2O$ (lithium oxide), $Na_2O$ (sodium oxide) is suitably used. Further, the thickness of the electron injecting layer 52 is preferably set to about 0.5 nm to 10 nm.

The cathode 53 has an area wider than a total area of the electron injecting layer 52 to cover the electron injecting layer 52. The cathode 53 is comprised of a first cathode made of a metallic material having low work function and provided on the electron injecting layer 52, and a second cathode provided on the first cathode to protect the first cathode. As the metallic material having low work function for forming the first cathode, in particular, a metallic material having work function of 3.0 eV or less is preferable. Specifically, Ca (work function; 2.6 eV), Sr (work function; 2.1 eV) or Ba (work function; 2.5 eV) is suitably used. The second cathode is provided to cover the first cathode so as to protect it from oxygen or moisture and increase conductance of the entire cathode 53. As a material for forming the second cathode, any material having chemical stability and relatively low work function may be used without limit. For example, an arbitrary material such as a metallic material or an alloy may be used. Specifically, Al (aluminum) or Ag (silver) is suitably used.

Moreover, the organic EL device 1 having the above-mentioned construction has a bottom emission structure, but the present invention is not limited to this structure. For example, the organic EL device 1 may be applied to a so-called top emission structure in which emitted light is derived from the sealing substrate 30 side.

The top emission type organic EL device has a construction in which emitted light is derived from the sealing substrate 30 at an opposite side to the substrate 10, and thus any one of a transparent substrate and a non-transparent substrate may be used. As the non-transparent substrate, for example, other than one in which an insulation treatment such as surface oxidization is performed on ceramic such as alumina, or a metallic sheet such as stainless steel, thermosetting resin or thermoplastic resin is exemplified.

As described above, in the present embodiment, the manufacturing method of an organic EL device comprises a step of film-forming the pixel electrode material 41 and the first partition material 42 on the interlayer insulating film 30, a step of patterning the pixel electrode material 41 and the first partition material 42 with the mask PR to form the pixel electrode 41a and the first partition 42a, and a step of forming the second partition 45 on the interlayer insulating film 30 and the first partition 42a. Thus, the resist mask for patterning the pixel electrode 41a does not contact the pixel electrode material 41. Therefore, it is possible to prevent the pixel electrode 41a from being contaminated due to the remnants of the resist mask. Further, since the light-emitting functional layer 47 such as the hole injecting layer 50 or the light-emitting 51 is formed on the pixel electrode 41a having a clean surface state, reliability of the light-emitting functional layer 47 is advanced, such that it is possible to provide a favorable organic EL device 1.

Further, the interlayer insulating film 30 is preferably made of an organic material. In this case, since the interlayer insulating film 30 may be formed by means of the wet film-forming method, it is possible to form a film with simple apparatus and low manufacturing cost, as compared to the vacuum film-forming method. Further, while, in the vacuum film-forming method, it is difficult to form a thick film, according to the wet film-forming method, the thick film may be easily formed.

Further, since, before film-forming the first partition material 42, the pixel electrode material 41 is formed on the interlayer insulating film 30, the interlayer insulating film 30 is protected by means of the pixel electrode material 41. Therefore, even when the first partition material 42 is film-formed using the plasma CVD method, there is no case in which the interlayer insulating film 30 itself is exposed to plasma. Thus, it is possible to prevent the interlayer insulating film 30 from being damaged due to plasma, and further it is possible to form the first partition material 42 stably.

Further, since the first partition 42a is formed only on the pixel electrode 41a, the total area of the pixel electrode 41a and the first partition 42a contacting the organic material becomes small as compared with the prior art. Therefore, in the case in which stress is caused in the interlayer insulating film 30 during the manufacturing process or in completed goods, the stress is reduced, and thus it is possible to suppress damage or separation generating.

Further, since the interlayer insulating film 30 and the first partition 42a are maintained not to contact each other, there is no case in which separation is generated in a joining surface of the interlayer insulating film 30 and the first partition 42a, which was a problem in the prior art.

Further, since the organic material is adopted as the material of the second partition 45, the interlayer insulating film 30 and the second partition 45 are made of the organic material together. Thus, it is possible to advance adhesion between the interlayer insulating film 30 and the second partition 45. And then, in such a structure, since the organic materials having the same hardness contact each other, it is also possible to advance the degree of strength of the organic EL device 1.

Further, even when the first partition material 42 is formed using the plasma CVD method, the interlayer insulating film 30 is not exposed at that time, and thus there is no case in which the organic material of the interlayer insulating film 30 is etched due to plasma damages. As a result, it is possible to prevent a manufacturing device from being contaminated due to etching of the organic material.

Further, in the prior art, since the first partition material 42 is formed on a plurality of layer films having the interlayer insulating film 30 and the pixel electrode material 41, it is difficult to control etching of the first partition material 42. However, in the present embodiment, since the first partition 42a is formed only on the pixel electrode material 41, it is possible to control favorably etching, and further it is possible to suppress non-uniform etching rate of the first partition 42a within its surface.

Further, since the pixel electrode material 41 and the first partition material 42 are sequentially film-formed on the interlayer insulating film 30 and patterned with the mask PR, it is not necessary to pattern the pixel electrode material 41 and the first partition material 42 separately, and then it is possible to simply the manufacturing process.

And then, in such a manufacturing method, the liquid droplet receiving portion 46 consisting of the first partition 42a and the second partition 45 on the pixel electrode 41a is formed. Thus, with the ink jet method, by ejecting the liquid material of the light-emitting functional layer 47 in the liquid droplet receiving portion 46 in liquid droplets, the light-emitting functional layer 47 can be formed within the liquid droplet receiving portion 46.

Further, since the manufacturing method further comprises the step of removing a portion of the first partition 42a to expose the pixel electrode 41a, with the liquid droplet ejection method, by ejecting the liquid material of the light-emitting functional layer 47 toward the pixel electrode 41a to land onto the electrode exposing portion 41b, the light-emitting functional layer 47 can be formed.

Further, in the step of forming the second partition 45, after the material of the second partition 45 is formed on the entire surface of the substrate 10, the opening portion 45a is formed in the portion corresponding to the pixel electrode 41a. Thus, the liquid droplet receiving portion 46 can be formed in the portion corresponding to the pixel electrode 41a.

Further, since the second partition 45 is formed after the electrode exposing portion 41b is formed, the material of the second partition 45 is coated on the entire surface of the electrode exposing portion 41b and the opening portion 45a is formed. Thus, after the opening portion 45a is formed, the electrode exposing portion 41b can be made to be surely exposed.

Further, since the pixel electrode material 41 and the first partition material 42 are collectively patterned according to the mask PR which is formed on the first partition material 42, to thereby form the first partition 42a and the pixel electrode 41a, the first partition 42a and the pixel electrode 41a can be formed according to the shape of the mask PR. In addition, since the first partition 42a and the pixel electrode 41a are formed with the collective patterning, it is possible to simply the number of the steps. Further, in this method, since the first partition 42a is not used as a mask, there is no case in which at the time of patterning the pixel electrode material 41, a wet etchant or an etching gas contacts the upper surface of the first partition 42a. Therefore, it is possible to prevent the wet etchant or the etching gas from influencing the upper surface of the first partition 42a.

Further, in the manufacturing method of the organic EL device 1, with the dry etching method, the pixel electrode material 41 and the first partition material 42 are patterned, such that the first partition 42a and the pixel electrode 41a are formed.

In such a manner, since the dry etching method is used, the interlayer insulating film 30 is not swelled due to a wet process, and thus it is possible to prevent the stress in the interlayer insulating film 30 from being caused.

Moreover, in the prior art, in the case in which the first partition material 42 is formed with the plasma CVD method, there are problems in that the first partition 42a and the interlayer insulating film 30 may be easily separated from each other and contamination within the vacuum chamber may be caused. In the present embodiment, however, since dry etching (plasma treatment) is performed in the patterning step, not in the film-forming step, contamination within the vacuum chamber due to the above-mentioned film separation is not caused.

Further, it is possible to manufacture the organic EL device 1 by means of the above-mentioned manufacturing method. Further, it is also possible to manufacture the substrate 2 for the organic EL device. As a result, the organic EL device and the substrate for the organic EL device have the same advantages as those of the above-mentioned manufacturing method.

(Second Embodiment of Manufacturing Method of Organic EL Device)

Next, a second embodiment of a manufacturing method of an organic EL device will be described with reference to FIGS. 4 and 5.

Figure 4A:
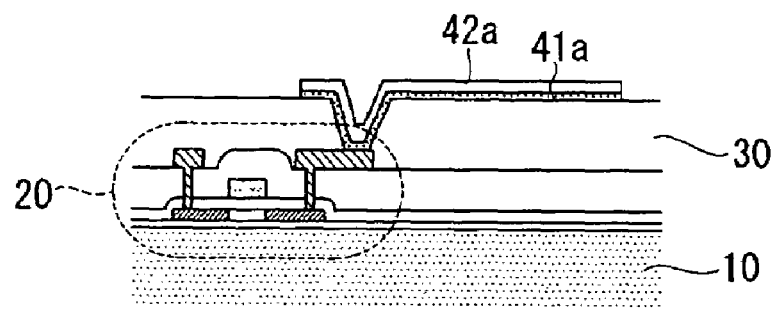
FIG. 4 is a diagram illustrating a manufacturing method of an organic EL device according to a second embodiment of the present invention.

Here, FIGS. 4(a) to 4(d) are diagrams illustrating the manufacturing method of the organic EL device, and FIG. 5 is a diagram illustrating FIG. 4(a) in detail.

Moreover, in the present embodiment, different portions from the portions of the first embodiment described above will be described. Therefore, the same reference numerals as those of the first embodiment represent the same elements, and then the descriptions on the same elements will be omitted.

First, as shown in FIG. 4(a), after the thin film transistor 20 and the interlayer insulating film 30 are formed on the substrate 10, the pixel electrode material 41 and the first partition material 42 are consecutively film-formed. In addition, the pixel electrode material 41 and the first partition material 42 are patterned, such that the pixel electrode 41a and the first partition 42a are formed.

Here, patterning of the pixel electrode material 41 and the first partition material 42 will be described in detail with reference to FIG. 5. FIG. 5 is a diagram showing essential parts of the interlayer insulating film 30, the pixel electrode material 41 and the first partition material 42 in FIG. 4(a). Further, FIG. 5 is a diagram showing a manufacturing process until the pixel electrode 41a and the first partition 42a are formed by means of etching. Moreover, in FIG. 5, though the contact hole 31 is not shown, it is assumed that the contact hole 31 is formed in a portion which is not shown, and the pixel electrode material 41 and the drain electrode 25D are connected to each other via the contact hole 31.

Figure 5A:
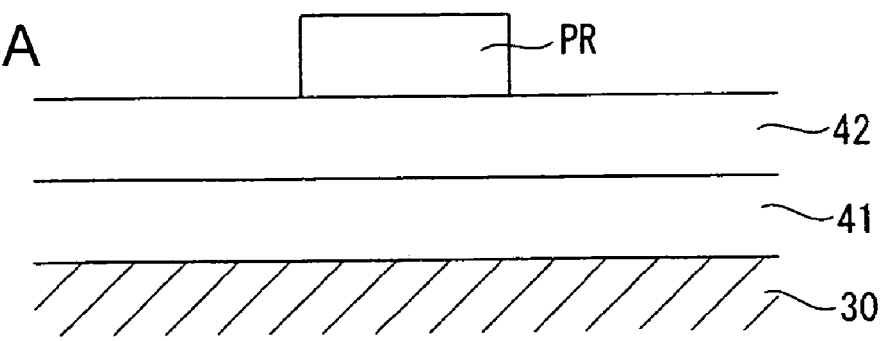
FIG. 5 is a diagram illustrating the manufacturing method of an organic EL device according to the second embodiment of the present invention.

First, as shown in FIG. 5(a), the mask PR is formed on the first partition material 42.

Figure 5B:
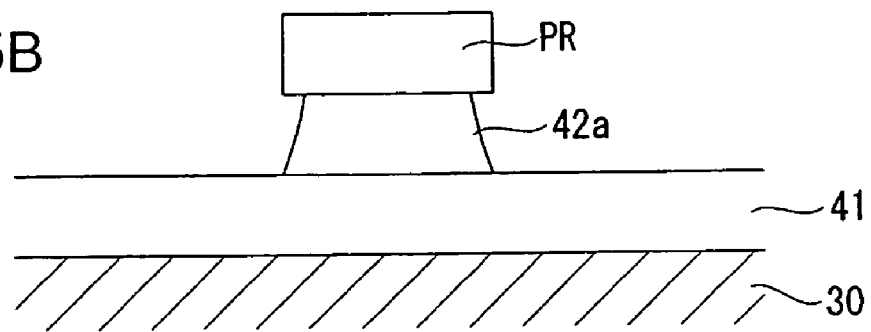

Next, as shown in FIG. 5(b), the first partition material 42 is etched according to the shape of the mask PR, and the first partition 42a is formed.

Figure 5C:
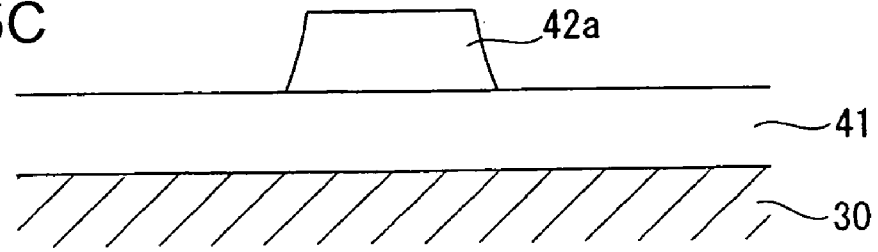

Next, as shown in FIG. 5(c), the mask PR is removed to make only the first partition 42a remain on the pixel electrode material 41.

Figure 5D:
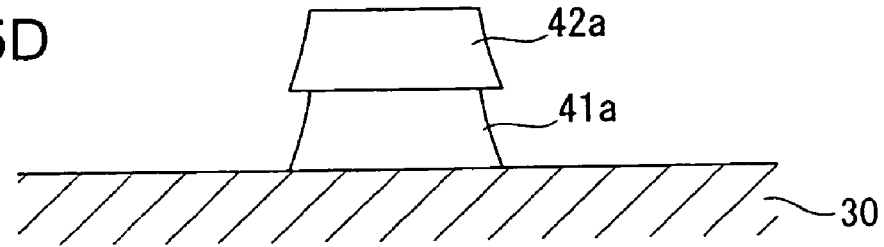

Next, as shown in FIG. 5(d), with the first partition 42a as a mask (mask of the same shape), the pixel electrode material 41 is etched according to the shape of the first partition 42a, such that the pixel electrode 41a is formed.

In such a manner, like the first embodiment, it is possible to form the pixel electrode 41a and the first partition 42a.

Next, returning to FIG. 4, the manufacturing method of the organic EL device will be described continuously.

Figure 4B:
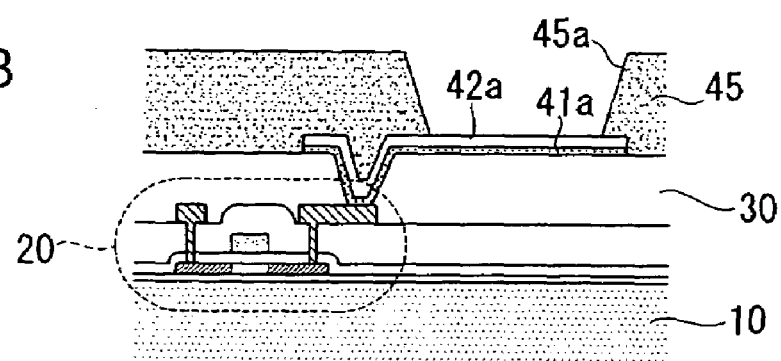

As shown in FIG. 4(b), the second partition 45 is formed to cover the interlayer insulating film 30 and the first partition material 42 (the step of forming the second partition on the interlayer insulating film and the first partition material). Moreover, the second partition 45 is formed when the pixel electrode 41a is not exposed.

Figure 4C:
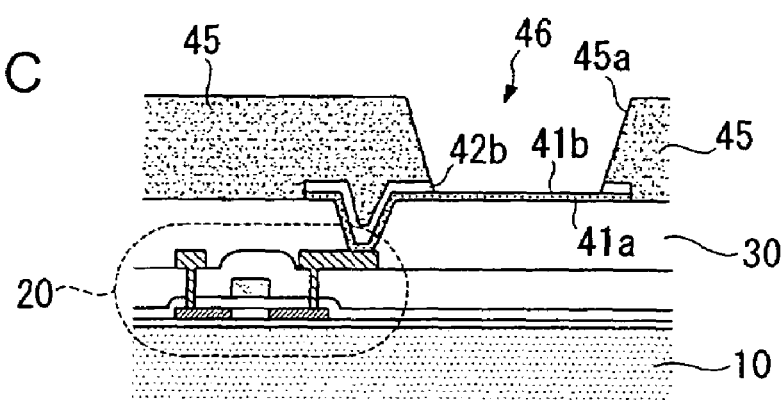

Next, as shown in FIG. 4(c), a portion of the first partition 42a is removed to expose the pixel electrode 41a, and then the electrode exposing portion 41b is formed (the step of removing the portion of the first partition to exposed the first electrode).

Here, the opening portion 45a of the second partition 45 serves as a mask, and the first partition material 42 is etched according to the pattern of the mask, such that the electrode exposing portion 41b is formed (a step of exposing the first electrode after the second partition is formed).

By means of such steps, the electrode exposing portion 41b is formed, and also the partition side portion 42b is exposed. Therefore, the liquid droplet receiving portion 46 is formed.

Figure 4D:
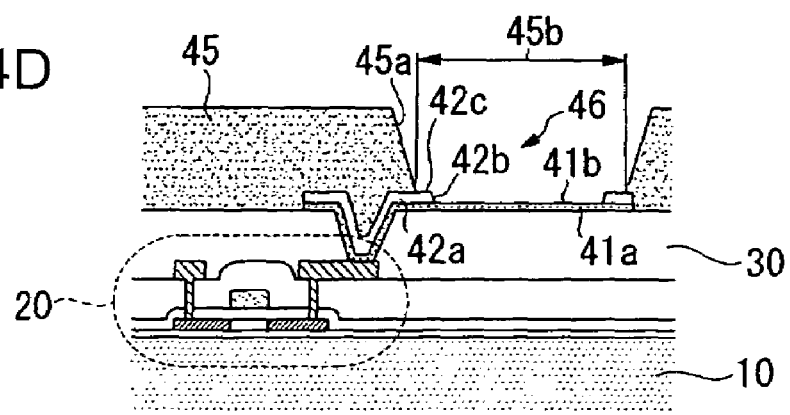

Next, as shown in FIG. 4(d), the second partition 45 is retreated, and then the opening area 45b of the opening portion 45a is expanded (a step of expanding the opening area of the second partition after the first electrode is exposed).

Here, in order to retreat the second partition, a well-known etching treatment is performed. For example, it may be dipped into an etchant, or an oxygen plasma treatment may be performed thereon.

In such a manner, if the second partition 45 is retreated, the upper portion of the first partition 42c is exposed. Thus, it becomes possible to make liquid droplets to be ejected in the light droplet receiving portion 46 get wet and spread suitably.

As described above, in the present embodiment, with the second partition 45 as the mask, the first partition 42a is patterned at a position corresponding to the opening portion 45a, and thus the pixel electrode 41a is exposed. Thus, it is not necessary for a mask, for example, a resist mask, which is only to expose the pixel electrode 41a, and it is possible to reduce the number of the masks. Therefore, it is possible to simply the manufacturing process.

Further, after the electrode exposing portion 41b is formed, the opening area 45b of the second partition 45 is expanded. Thus, the upper portion 42c of the first partition 42a covered with the second partition 45 is exposed, and the exposed area of the first partition 42a becomes large. Therefore, in the case in which the liquid material of the light-emitting functional layer is coated and formed on the liquid droplet receiving portion 46 using the liquid droplet ejection method, the contact area of the liquid material and the first partition 42a becomes large. That is, it is possible to make the liquid material on the first partition 42a having a lyophilic property get wet and spread suitably, and further it is possible to make the liquid material surely contact the first electrode 41a. Further, when patterning the first partition 42a and the second partition 45, it is necessary for an exposure mask to expose the resist mask separately. In the prior art, there was a need for controlling the upper portion 42c of the first partition by aligning an exposure pattern for the first partition 42a with an exposure pattern for the second partition 45. To the contrary, in the present invention, since the resist mask is not used, it is possible to control the upper portion 42c of the first partition in a self-alignment manner. Therefore, it is possible to make the liquid material on the first partition 42a and the pixel electrode 41a having a lyophilic property get wet and spread suitably, and further it is possible to make the liquid material surely contact the first electrode 41a.

Further, the first partition material 42 is patterned according to the mask PR formed on the first partition material 42 to form the first partition 42a, and the pixel electrode material 41 is patterned with the first partition 42a as a mask to form the pixel electrode 41a. Thus, it is possible to form the first partition 42a according to the shape of the mask PR, and it is possible to form the pixel electrode 41a according to the shape of the first partition 42a. Therefore, it is possible to form the first partition 42a and the pixel electrode 41a with the mask of the same shape.

Moreover, in the above-mentioned first and second embodiments, the pixel electrode 41a is formed on the interlayer insulating film 30, but, in addition, the adhesion imparting film may be formed on the interlayer insulating film 30 to advance adhesion between the interlayer insulating film 30 and the pixel electrode 41a. As the adhesion imparting film, a metallic film such as Ti or Mo is suitably adopted. If doing so, since the adhesion imparting film surely adheres between the interlayer insulating film 30 and the pixel electrode 41a, it is possible to advance the degree of strength of the organic EL device 1 or the substrate 2 for the organic EL device.

(Electronic Apparatus)

Next, an example of an electronic apparatus comprising the organic EL device of the above-mentioned embodiment will be described.

Figure 6A:
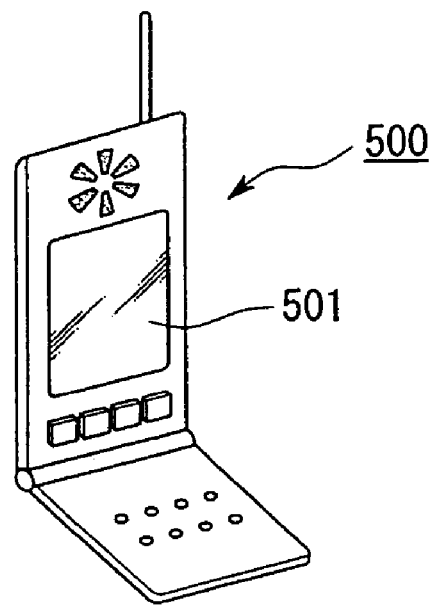
FIG. 6 is a diagram showing an electronic apparatus comprising an organic EL device of the present invention.

FIG. 6(a) is a perspective view showing an example of a cellular phone. In FIG. 6(a), a reference numeral 500 denotes a main body of a cellular phone, and a reference numeral 501 denotes a display unit comprising an organic EL device.

Figure 6B:
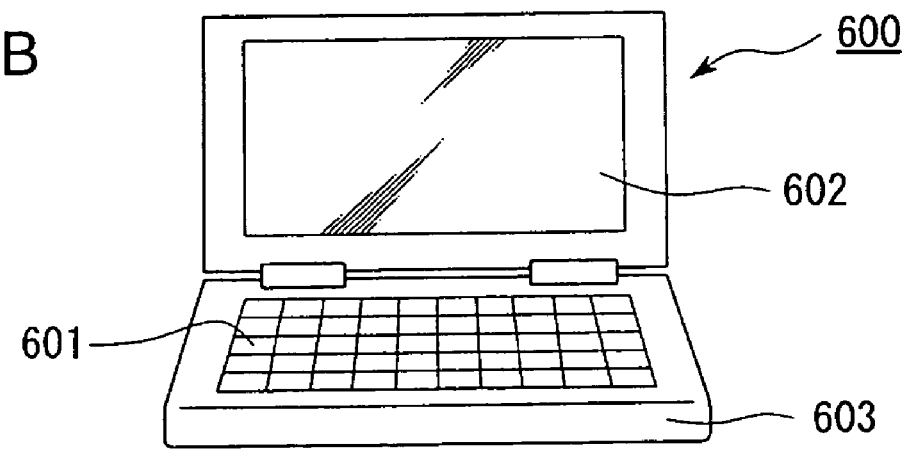

FIG. 6(b) is a perspective view showing an example of a portable information processing device such as a word processor or a personal computer. In FIG. 6(b), a reference numeral 600 denotes an information processing device, a reference numeral 601 denotes an input unit such as a keyboard, a reference numeral 603 denotes an information processing medium, and a reference numeral 602 denotes a display unit comprising an organic EL device.

Figure 6C:
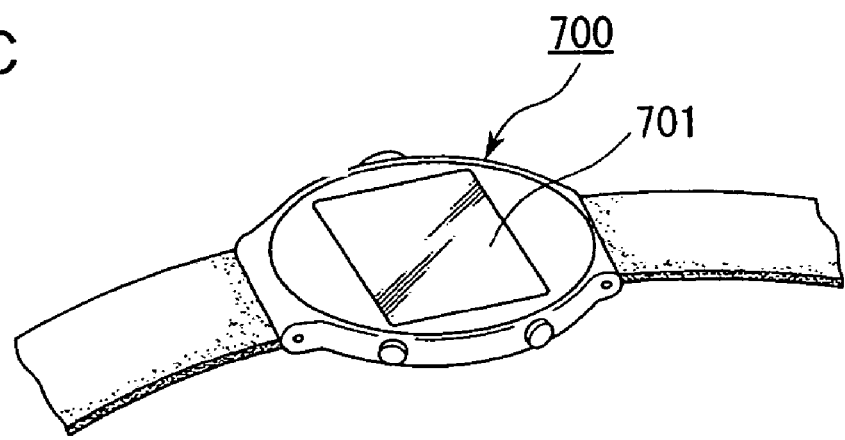
Figure 7A:
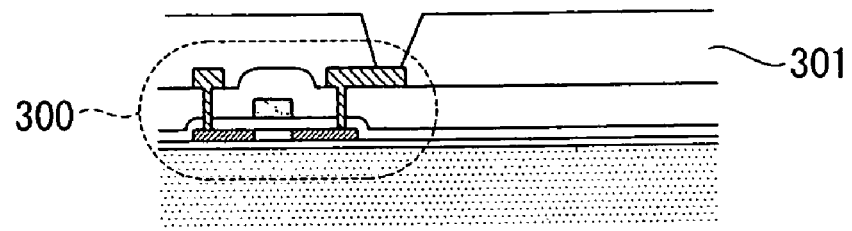
FIG. 7 is a diagram illustrating a manufacturing method of a conventional organic EL device.
Figure 7B:
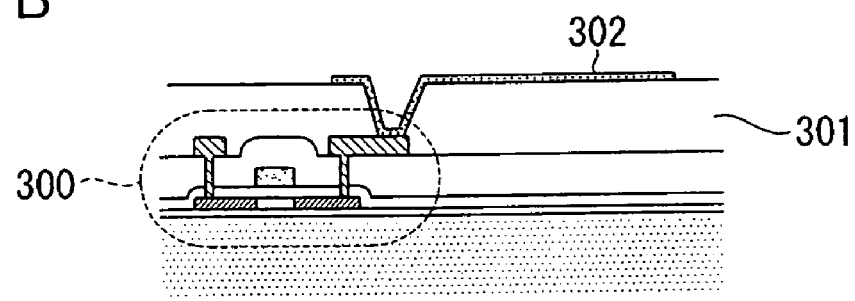
Figure 7C:
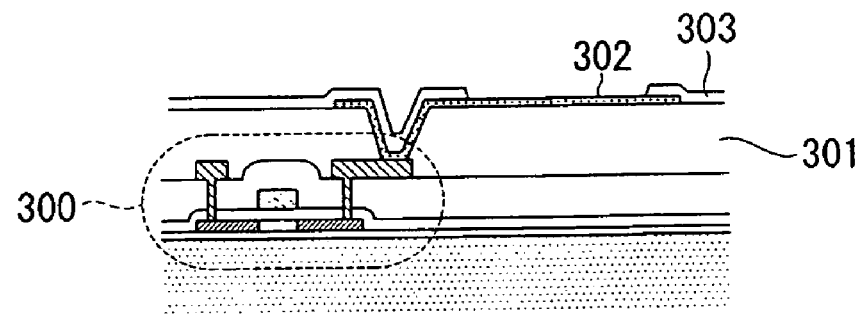
Figure 7D:
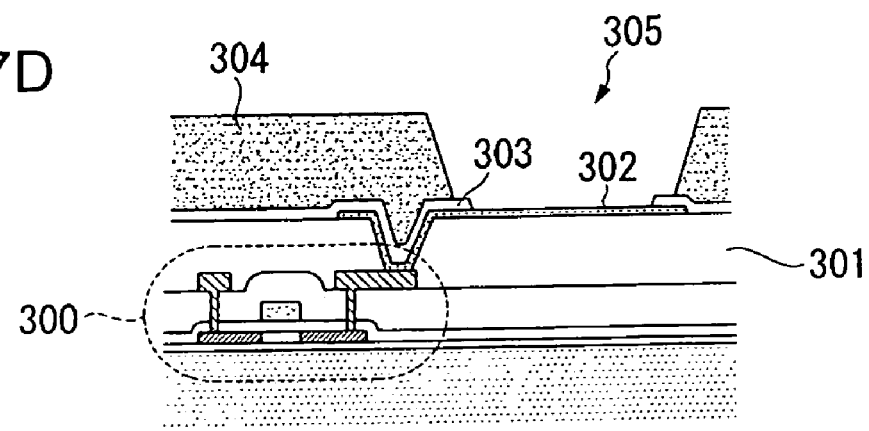

FIG. 6(c) is a perspective view showing an example of a wrist watch type electronic apparatus. In FIG. 6(c), a reference numeral 700 denotes a main body of a watch, and a reference numeral 701 denotes a display unit comprising an organic EL device.

The electronic apparatuses shown in FIGS. 6(a) to 6(c) comprise the organic EL device described in the above-mentioned embodiment, and thus they have favorable display characteristics.

Moreover, an electronic apparatus is not limited to the above-mentioned apparatuses. That is, the present invention can be applied to various electronic apparatuses. For example, the present invention can be applied to electronic apparatuses such as a desktop computer, a liquid crystal projector, a multimedia personal computer (PC) and an engineering workstation (EWS), a pager, a word processor, a television, a view finder type or monitor-direct-view type video tape recorder, an electronic organizer, an electronic calculator, a car navigation device, a POS terminal, a device comprising a touch panel and so on.

What is claimed is:

1. A method of manufacturing an organic electroluminescent device having, on a first electrode, a light-emitting functional layer surrounded by a first partition and a second partition, the method comprising:
    a step of sequentially film-forming a first electrode material and a first partition material, on an interlayer insulating film;
    a step of patterning the first electrode material and the first partition material with a mask to form the first electrode and the first partition in the same shape; and
    a step of forming the second partition on the interlayer insulating film and the first partition material.

2. The method of manufacturing an organic electroluminescent device according to claim 1,
    wherein the interlayer insulating film is made of an organic material.

3. The method of manufacturing an organic electroluminescent device according to claim 1, further comprising:
    a step of removing a portion of the first partition to expose the first electrode.

4. The method of manufacturing an organic electroluminescent device according to claim 1,
    wherein the step of forming the second partition is performed by forming a second partition material on an entire surface of a substrate and forming an opening portion in a portion corresponding to the first electrode.

5. The method of manufacturing an organic electroluminescent device according to claim 1,
    wherein after the first electrode is exposed, the second partition is formed.

6. The method of manufacturing an organic electroluminescent device according to claim 1,
    wherein after the second partition is formed, the first electrode is exposed.

7. The method of manufacturing an organic electroluminescent device according to claim 6,
    wherein after the first electrode is exposed, an opening area of the second partition is expanded.

8. The method of manufacturing an organic electroluminescent device according to claim 1,
wherein the first partition is formed by patterning the first partition material according to the mask formed on the first partition material, and the first electrode is formed by patterning the first electrode material using the first partition as a mask.

9. The method of manufacturing an organic electroluminescent device according to claim 1,
wherein the first partition and the first electrode are formed by collectively patterning the first electrode material and the first partition material according to the shape of the mask formed on the first partition material.

10. The method of manufacturing an organic electroluminescent device according to claim 8,
wherein the first partition and the first electrode are formed by patterning the first partition material and the first electrode material using a dry etching method.

11. The method of manufacturing an organic electroluminescent device according to claim 1,
wherein an adhesion imparting film is formed on the interlayer insulating film to impart adhesion between the interlayer insulating film and the first electrode.

12. An organic electroluminescent device having, on a first electrode, a light-emitting functional layer surrounded by a first partition and a second partition,
wherein the first partition and the second partition are formed on side portions of the light-emitting functional layer, and
the first partition is formed only on the first electrode, and the second partition is formed on an interlayer insulating film and the first partition.

13. A substrate for an organic electroluminescent device having a first partition formed on a first electrode,
wherein the first electrode is formed on an interlayer insulating film, and the first partition is formed only on the first electrode, and a second partition is formed on the interlayer insulating film and the first partition.

14. An electronic apparatus comprising an organic electroluminescent device as claimed in claim 12.

* * * * *